United States Patent [19]

Wieder et al.

[11] Patent Number: 4,581,319

[45] Date of Patent: Apr. 8, 1986

[54] METHOD FOR THE MANUFACTURE OF BIPOLAR TRANSISTOR STRUCTURES WITH SELF-ADJUSTING EMITTER AND BASE REGIONS FOR EXTREME HIGH FREQUENCY CIRCUITS

[75] Inventors: Armin Wieder, Gauting; Hans-Christian Schaber, Germering; Siegfried Schwarzl, Ottobrunn, all of Fed. Rep. of Germany

[73] Assignee: Siemens Aktiengesellschaft, Berlin & Munich, Fed. Rep. of Germany

[21] Appl. No.: 616,113

[22] Filed: Jun. 1, 1984

[30] Foreign Application Priority Data

Aug. 26, 1983 [DE] Fed. Rep. of Germany ....... 3330895

[51] Int. Cl.[4] .............................. G03C 5/00; B44C 1/22
[52] U.S. Cl. .................................... 430/314; 430/316; 430/317; 430/319; 430/330; 148/1.5; 156/643; 156/653; 156/661.1
[58] Field of Search ............... 430/313, 314, 315, 316, 430/317, 319, 330, 323, 324; 148/1.5, 187; 156/643, 661.1, 653

[56] References Cited

U.S. PATENT DOCUMENTS

4,157,269 6/1979 Ning et al. ............................ 148/1.5
4,459,325 7/1984 Nozawa et al. ....................... 427/93
4,483,726 11/1984 Isaac et al. ............................ 148/187
4,492,008 1/1985 Anantha et al. ....................... 29/571

OTHER PUBLICATIONS

IEEE Transactions on Electron Devices, vol. ED-28, No. 9, Sep. 1981, "Self-Aligned Bipolar Transistors for High-Performance and Low-Power-Delay VLSI", by Tak H. Ning et al, pp. 1010-1013.

Primary Examiner—John E. Kittle
Assistant Examiner—José G. Dees
Attorney, Agent, or Firm—Hill, Van Santen, Steadman & Simpson

[57] ABSTRACT

A method for the manufacture of bipolar transistor structures with self-adjusted emitter and base regions wherein the emitter and base regions are generated by an out-diffusion from doped polysilicon layers. Dry etching processes which produce vertical etching profiles are employed for structuring the $SiO_2$ and polysilicon layers. The employment of additional oxidation processes for broadening the lateral edge insulation (see arrow 9) during the manufacture of the bipolar transistor structures enables self-adjusted emitter-base structures with high reproducibility in addition to advantages with respect to the electrical parameters. The method is employed for the manufacture of VLSI circuits in bipolar technology.

14 Claims, 6 Drawing Figures

METHOD FOR THE MANUFACTURE OF BIPOLAR TRANSISTOR STRUCTURES WITH SELF-ADJUSTING EMITTER AND BASE REGIONS FOR EXTREME HIGH FREQUENCY CIRCUITS

BACKGROUND OF THE INVENTION

The invention relates to a method for the manufacture of bipolar transistor structures with self-aligned emitter-base regions for extreme high frequency circuits. Both the emitter region as well as the base region in the semiconductor substrate are generated by means of out-diffusion of the structures comprising doped polysilicon layers deposited directly on the substrate. The emitter region is centrally generated in the base region by means of silicon oxide layers as masking and insulating layers such that the active base zone arises under the emitter region, as does an inactive base zone which is symmetrical thereto. Dry etching methods producing vertical etching profiles are employed for structuring the silicon oxide and polysilicon layers.

In traditional bipolar structures, the base and emitter regions are generated by means of ion implantation of dopants and out-diffusion of the doped ions into the silicon substrate, whereby the emitter must be adjusted in overlap-free fashion into the base region with corresponding adjustment tolerances. This requirement causes relatively large structures which are also determined by the entire metal grid since contacts must be produced from the metal interconnect level both to the emitter and collector zone as well as to the base zone.

The self-adjusted manufacture of emitter and base, such as has already been proposed in the initially described method, fundamentally excludes these disadvantages. The realization of the structures with the assistance of doped polysilicon enables the exploitation of various further advantages such as significantly lower base resistances, smaller capacitances, and the possibility of a local wiring in the polysilicon levels.

A method in which self-adjusted emitter-base bipolar structures for high demands given low powers and low gate transit times can also be manufactured may be derived from an article by Ning et al in the IEEE Transactions on Electron Devices, Vol. ED-28, No. 9, September 1981, pages 1010 through 1013, incorporated herein by reference. Given this method, the separation of the emitter-base contact is defined only by the thickness of the edge oxide. This amounts to 0.4 $\mu$m in the region of the silicon substrate. The edge oxide is deposited after the structuring of the boron-doped polysilicon layer forming the base terminal for the purpose of exposing the emitter region. This occurs partially by means of dry etching which produces vertical etching profiles and, for the rest of the layer thickness, by means of a doping-selective, wet-chemical etching in a hydrofluoric acid/nitric acid/acetic acid etching mixture.

The self-adjusted emitter-base structures obtained by means of the known methods have the deficiency that they cannot be manufactured with sufficient reproducibility, since the lateral underetching that is unavoidable given the wet-chemical etching step is difficult to control.

SUMMARY OF THE INVENTION

It is an object of the invention to specify a method by means of which self-adjusted polysilicon emitter-base structures for bipolar transistors can be reproducibly manufactured and in simple method steps.

Given a method of the type initially cited, this object is achieved by means of the sequence of the following method steps:

(a) application of a first silicon oxide layer to a silicon semiconductor substrate and structuring of the first oxide layer such that the region destined for the base is exposed at the substrate surface;

(b) surface-wide deposition of a first polysilicon layer and implantation of the first polysilicon layer with boron ions up to a range that corresponds to a maximum of half the layer thickness;

(c) deposition of a surface-wide second silicon oxide layer;

(d) execution of a photoresist technique for the definition of the base region and of the emitter region lying in the base region;

(e) execution of an anisotropic, reactive ion etching method for the removal of the second silicon oxide layer not covered by the photoresist mask;

(f) execution of an anisotropic, reactive ion etching method for the removal of the first polysilicon layer not covered by the second silicon oxide layer to such degree that a maximum of about 100 nm of the first polysilicon layer remains on the substrate surface;

(g) generation of a third silicon oxide layer for the manufacture of the edge insulation by means of oxidation of the remaining poly-Si layer;

(h) deposition of a fourth silicon oxide layer for the broadening of the edge insulation;

(i) execution of an anisotropic, reactive ion etching process without mask for the removal of the fourth silicon oxide layer with the exception of the edge insulation and for the removal of the third silicon oxide layer in the emitter region, whereby the vertical etching rate compared to the lateral etching rate is >5:1, and the oxide etching rate compared to the silicon etching rate is >15:1;

(j) deposition and structuring of a second, arsenic-doped or antimony-doped polysilicon layer in the emitter region;

(k) execution of a thermal treatment for the activation of the emitter region; and (l) opening the contacts to the polysilicon regions.

Due to the broadening of the lateral edge insulation (spacer) because of the good edge covering oxide layer, the method according to the teaching of the invention provides the possibility of reproducibly manufacturing bipolar transistor structures for extremely high demands consistent with small base-collector capacitances and low base resistances, i.e. of reproducibly producing high switching speeds in the final analysis.

DESCRIPTION OF THE PREFERRED EMBODIMENTS

Figure 1:
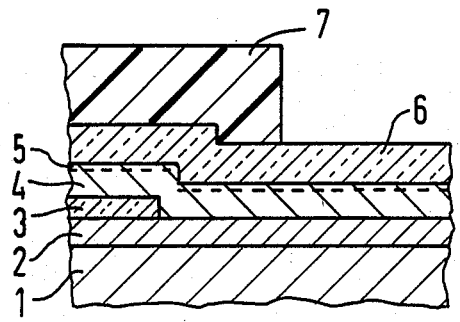
FIGS. 1 through 6 show cross-sections of successive manufacturing steps according to the invention. For greater clarity, only a mirror symmetrical half of an emitter-base-contact region of the arrangement is shown in FIGS. 1 through 5. Identical reference characters apply to identical parts in all figures.

In FIG. 1, a first silicon oxide layer 3 is applied in a layer thickness in a range from 200 to 400 nm to an n+ doped silicon substrate 1 provided with an n− doped epitaxial layer 2. The first silicon oxide layer 3 is structured such that a region corresponding to the base zone to be formed is exposed on the substrate surface 1,2. This is followed by a first surface-wide deposition (300 nm) of undoped polysilicon 4 from the vapor phase by means of thermal decomposition of hydrosilicon which is subsequently implanted with boron ions in its uppermost layer 5, whereby a high dose of approximately $5 \times 10^{15}$ cm$^{-2}$ and a low energy of approximately 40 keV are used. A second SiO$_2$ layer 6 in a layer thickness of 400 nm is applied surface-wide to the polysilicon layer 4,5 by means of a CVD method (chemical vapor deposition). The self-adjusted emitter-base regions (the regions 12 and 14 in FIG. 6) are then defined with a photoresist mask 7. The structure shown in FIG. 1 arises.

Figure 2:
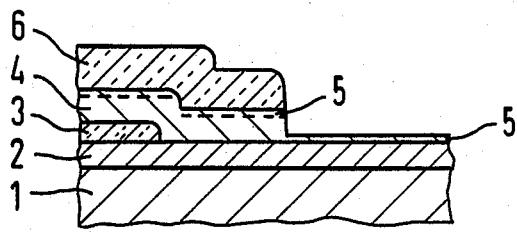

In FIG. 2 with the assistance of a reactive ion etching process initially conducted by means of a gas mixture consisting of trifluoromethane and 5 to 8% oxygen, the exposed oxide 6 is now removed by use of the photoresist mask 7 and the poly-Si 4,5 is subsequently etched away down to a residual layer of approximately 50 nm by means of a mixture consisting of boron tirchloride, chlorine and helium, whereby the precise etching stop can be uncritically defined and thus defined by means of the color change on the silicon substrate 1,2 which is nearly completely covered with oxide 3. The arrangement according to FIG. 2 results.

The next method steps serve for creation of the oxide edge insulation 9.

Figure 3:
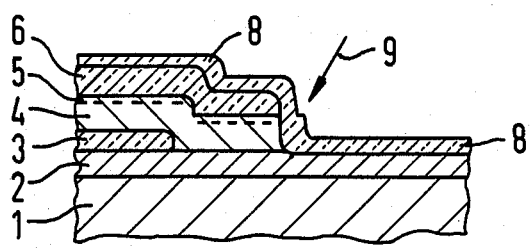

In FIG. 3 the manufacture of the third, approximately 150 nm thick oxide layer 8 occurs by means of -oxidation at atmospheric pressure or in the high pressure range in order to prevent the formation of oxidation-induced stacking faults, and in order to reduce the lateral out-diffusion of boron 5 into the polysilicon layer 4. The high pressure is preferred. The oxidation occurs, for example, at 800° C. for 5 hours under normal pressure or for about 20 minutes at 800° C. under a pressure of 20 bars. As shown by the arrow 9, an edge coverage is already achieved at the polysilicon edges 4,5 by means of the oxidation.

Figure 4:
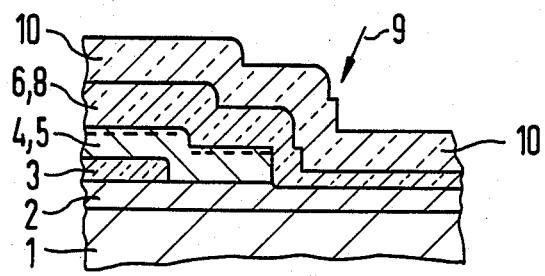

In FIG. 4, a further, fourth oxide layer 10 is deposited from the vapor phase (CVD process) in a layer thickness of 250 nm on the third oxide layer 8 produced by means of oxidation, this being undertaken in order to broaden the lateral edge insulation (spacer, see arrow 9).

Figure 5:
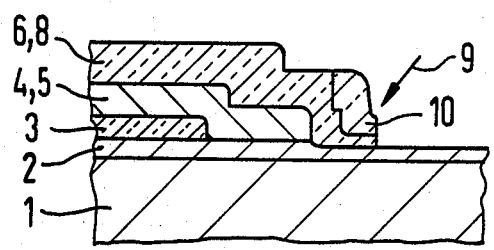

In FIG. 5, by means of an anisotropic etching process, for example by means of reactive ion etching (RIE) in a trifluoromethane/oxygen mixture, first the fourth silicon oxide layer 10—with the exception of the edge insulation (see arrow 9)—and then the third silicon oxide layer 8 in the emitter region 12 are removed in a layer thickness of 400 nm with sufficient selectivity to the mono-crystalline silicon substrate 1,2 without masking, i.e. in surface-wide fashion, whereby the ratio of the vertical etching rate to the lateral etching rate $>5:1$ and the ratio of the oxide etching rate to the silicon etching rate $>15:1$ applies. As a result of this etching process, the base region is insulated in a self-adjusting fashion from the emitter region by means of the lateral edge insulation 9.

Figure 6:
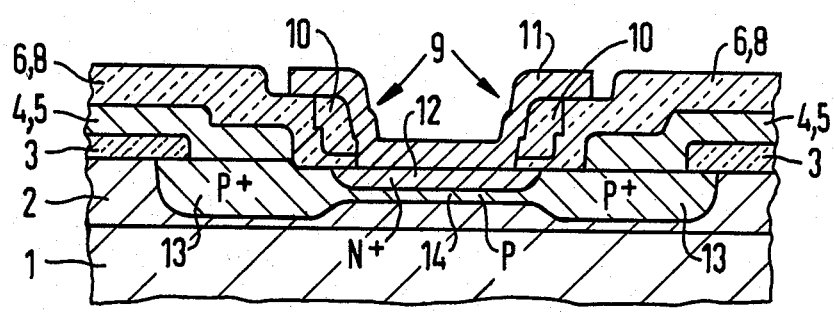

In FIG. 6, a careful surface treatment of the silicon substrate 1, 2 in the exposed emitter region 12 is executed in order to avoid contamination and roughness. This is executed before the polysilicon deposition for the polysilicon emitter, whereby the formation of a thin ($<3$ nm), closed oxide layer at the boundary surface may possibly prove advantageous for the electrical parameters. This oxide layer, however, can also be omitted. A second polysilicon layer 11 comprising n$^+$ doped polysilicon (arsenic) is then deposited and structured such that it covers the emitter region 12 overlapping on the first polysilicon layer 4,5. Subsequently, although no longer shown in FIG. 6, the insulating oxide is applied as a fifth silicon oxide layer and the structure is activated in a single high-temperature step (T=950° through 1000° C., t=approximately 30 minutes). Thus the boron doping from the first polysilicon layer 4,5 for the active base zone 14 can occur both into the mono-crystalline silicon substrate 1,2 as well as into the polysilicon layer 11 of the emitter. The active base zone referenced 14, the inactive base zone 13, and the very flat emitter zone 12 thus arises. Given this arrangement, the contacts to the polysilicon regions and to the collector region are then opened and the transistor terminals are metallized in known fashion.

Although various minor changes and modifications might be proposed by those skilled in the art, it will be understood that we wish to include within the claims of the patent warranted hereon all such changes and modifications as reasonably come within our contribution to the art.

We claim as our invention:

1. A method for the manufacture of bipolar transistor structures with self-adjusting emitter-base regions for extreme high frequency circuits wherein both the emitter region and the base region in a silicon semiconductor substrate are generated by an out-diffusion of doped polysilicon layers deposited directly on the substrate, the emitter region being centrally generated in the base region by masking and insulating silicon oxide layers such that an active base zone arises uder the emitter region along with an inactive base zone symmetrical thereto, and wherein dry etching methods producing vertical etching profiles are employed for structuring the silicon oxide and polysilicon layers, comprising the steps of:

(a) structuring a first silicon oxide layer on the silicon substrate such that a region to be used for the base region is exposed at a surface of the substrate;

(b) depositing a first polysilicon layer and implanting the layer with ions up to a maximum depth corresponding to half of the first polysilicon layer thickness;

(c) depositing a second silicon oxide layer;

(d) executing a photoresist process for defining the base region and the emitter region lying in the base region;

(e) executing an anisotropic, reactive ion etching process for removal of the second silicon oxide layer not covered by the photoresist mask;

(f) executing an anisotropic, reactive ion etching process for removal of the first polysilicon layer not covered by the second silicon oxide layer to such degree that a maximum of about 100 nm of the first polysilicon layer remains on the substrate surface;

(g) generating a third silicon oxide layer for manufacture of an edge insulation by oxidation of the remaining polysilicon layer;

(h) depositing a fourth silicon oxide layer on the third silicon oxide layer for broadening of the edge insulation;

(i) executing an anisotropic, reactive etching process without a mask for removal of said fourth silicon oxide layer with the exception of the edge insulation and for the removal of said third silicon oxide layer in the emitter region such that a ratio of a vertical etching rate to a lateral etching rate >5:1 and a ratio of an oxide etching rate to a silicon etching rate >15:1;

(j) depositing and structuring a second doped polysilicon layer in the emitter region;

(k) executing a thermal treatment for activation of the emitter region; and (l) providing contacts to the polysilicon regions connecting to the base and emitter regions.

2. A method according to claim 1 including the steps of employing an n-doped silicon substrate with an n⁻ doped epitaxial layer.

3. A method according to claim 1 including the step of applying the first silicon oxide layer on the substrate and then structuring the layer in method step (a).

4. A method according to claim 1 including the step of employing a trench insulation technique in method step (a).

5. A method according to claim 1 including the step of employing a local oxidation technique (LOCOS technique) in method step (a).

6. A method according to claim 1 including the steps of setting a thickness of the second oxide layer according to method step (c) to a value of approximately 400 nm, setting a thickness of the third oxide layer according to method step (g) to a value of approximately 150 nm, and setting a thickness of the fourth oxide layer according to method step (h) to a value of approximately 250 nm.

7. A method according to claim 1 including the steps of setting a thickness of the first and second polysilicon layers to a value of approximately 300 nm.

8. A method according to claim 1 wherein the implantation of method step (b) uses boron ions and including the steps of setting a dosage of $5 \times 10^{15}$ cm$^{-2}$ and an energy of 40 keV for the boron ion implantation according to method step (b).

9. A method according to claim 1 wherein the reactive ion etching process according to method steps (e) and (i) is executed with a mixture of trifluoromethane (CHF$_3$) and 5 to 8% oxygen, and the reactive ion etching process according to method step (f) is executed with a mixture comprising boron trichloride (BCl$_3$), chlorine and helium.

10. A method according to claim 1 wherein the thermal treatment according to method step (l) is executed for 30 minutes in a range from 950° to 1000° C.

11. A method according to claim 1 wherein the generation of the silicon oxide layer according to method step (g) occurs at normal pressure over 5 hours at 800° C.

12. A method according to claim 1 wherein the generation of the silicon oxide layer according to method step (g) occurs under a high pressure on the order of approximately 20 bars in 20 minutes at 800° C.

13. A method according to claim 1 wherein in method step (j) the second polysilicon layer is doped with arsenic.

14. A method according to claim 1 wherein in method step (j) the second polysilicon layer is doped with antimony.

* * * * *